United States Patent
Lim

(10) Patent No.: US 9,980,387 B2
(45) Date of Patent: May 22, 2018

(54) FLEXIBLE PRINTED CIRCUIT BOARD AND DISPLAY DEVICE INCLUDING THE SAME

(71) Applicant: Samsung Display Co., Ltd., Yongin (KR)

(72) Inventor: Hwa Su Lim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 207 days.

(21) Appl. No.: 14/676,361

(22) Filed: Apr. 1, 2015

(65) Prior Publication Data

US 2016/0128174 A1 May 5, 2016

(30) Foreign Application Priority Data

Nov. 5, 2014 (KR) .................. 10-2014-0152975

(51) Int. Cl.
| | | |
|---|---|---|
| *H05K 1/00* | (2006.01) | |
| *H05K 1/18* | (2006.01) | |
| *G02F 1/133* | (2006.01) | |
| *H05K 1/11* | (2006.01) | |

(52) U.S. Cl.
CPC ............ *H05K 1/189* (2013.01); *G02F 1/133* (2013.01); *H05K 1/117* (2013.01); *H05K 2201/09781* (2013.01); *H05K 2201/10128* (2013.01); *H05K 2201/10136* (2013.01)

(58) Field of Classification Search
CPC ........ G02F 1/133; H05K 1/117; H05K 1/189; H05K 2201/09781; H05K 2201/10128; H05K 2201/10136
See application file for complete search history.

(56) References Cited

U.S. PATENT DOCUMENTS

| | | | |
|---|---|---|---|
| 7,533,085 B2 | 9/2009 | Watanabe et al. | |
| 2008/0170102 A1* | 7/2008 | Kim | ..................... B41J 2/14072 347/50 |
| 2008/0253074 A1 | 10/2008 | Shie | |
| 2008/0277145 A1* | 11/2008 | Lin | ........................ H05K 1/028 174/254 |
| 2008/0304000 A1* | 12/2008 | Abe | .................... G02F 1/13452 349/150 |
| 2009/0213534 A1* | 8/2009 | Sakai | .................. G02F 1/13452 361/679.21 |
| 2014/0353639 A1* | 12/2014 | Sakamoto | ........... H01L 51/5246 257/40 |
| 2015/0028307 A1* | 1/2015 | Kim | ........................ H01L 51/56 257/40 |
| 2015/0029680 A1* | 1/2015 | Saito | .................... H05K 1/0269 361/748 |

FOREIGN PATENT DOCUMENTS

| | | |
|---|---|---|
| JP | 2006-303238 | 11/2006 |
| KR | 10-2000-0073836 | 12/2000 |
| KR | 10-2007-0009402 | 1/2007 |

* cited by examiner

*Primary Examiner* — Yuriy Semenenko
(74) *Attorney, Agent, or Firm* — H.C. Park & Associates, PLC

(57) ABSTRACT

A display device including a display panel including a substrate having one side on which a first conductive pattern is arranged, a flexible printed circuit board having one side on which a second conductive pattern that is connected to the first conductive pattern is arranged, and a dam pad positioned between the substrate and the flexible printed circuit board to be spaced apart from an area to which the second conductive pattern is connected.

14 Claims, 15 Drawing Sheets

US 9,980,387 B2

FLEXIBLE PRINTED CIRCUIT BOARD AND DISPLAY DEVICE INCLUDING THE SAME

CROSS-REFERENCE TO RELATED APPLICATION

This application claims priority from and the benefit of Korean Patent Application No. 10-2014-0152975, filed on Nov. 5, 2014, which is hereby incorporated by reference for all purposes as if fully set forth herein.

BACKGROUND

Field

Exemplary embodiments relate to a flexible printed circuit board and a display device including the same.

Discussion of the Background

Recently, display devices have been applied to various kinds of devices, such as televisions, monitors, notebook computers, mobile phones, PDAs, and smart phones. Although various specifications are required for each respective application, increased display resolution and reduced thickness of the display devices is generally beneficial and desired regardless of the product group. To meet the above-described requirements in the recent display devices, a large number of signal wires are required to be densely arranged in a small space, and high-performance driving chips for processing complicated signals are positioned adjacent the display panel. The driving chips or driving units of other display devices receive signals from another location. For this, a bonding pad is provided on the side of a panel, and a flexible printed circuit board is attached to the bonding pad.

However, due to the influence of environmental elements, such as moisture permeation, bonding areas between the panel and the flexible printed circuit board may be separated from each other, or corrosion may occur therein. The occurrence of such bonding problems or corrosion may cause a defect and failure of the display device.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide a flexible printed circuit board and a display device including the same, which can prevent moisture from permeating into bonding areas of the flexible printed circuit board and a display panel.

Exemplary embodiments also provide a flexible printed circuit board and a display device including the same, which can prevent bonding areas of the flexible printed circuit board and a display panel from being separated from each other by an external pressure.

Additional aspects will be set forth in the detailed description which follows, and, in part, will be apparent from the disclosure, or may be learned by practice of the inventive concept.

An exemplary embodiment of the present invention discloses a display device including a display panel including a substrate having one side on which a first conductive pattern is arranged, a flexible printed circuit board having one side on which a second conductive pattern that is connected to the first conductive pattern is arranged, and a dam pad positioned between the substrate and the flexible printed circuit board to be spaced apart from an area to which the second conductive pattern is connected.

An exemplary embodiment of the present invention also discloses a flexible printed circuit board comprising, a base film having one surface and the other surface, a first conductive pattern positioned at an edge of one side of the one surface of the base film, and a dam pad positioned on the one surface of the base film to be spaced apart from the first conductive pattern and positioned on an inner side of the one surface relative the first conductive pattern.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
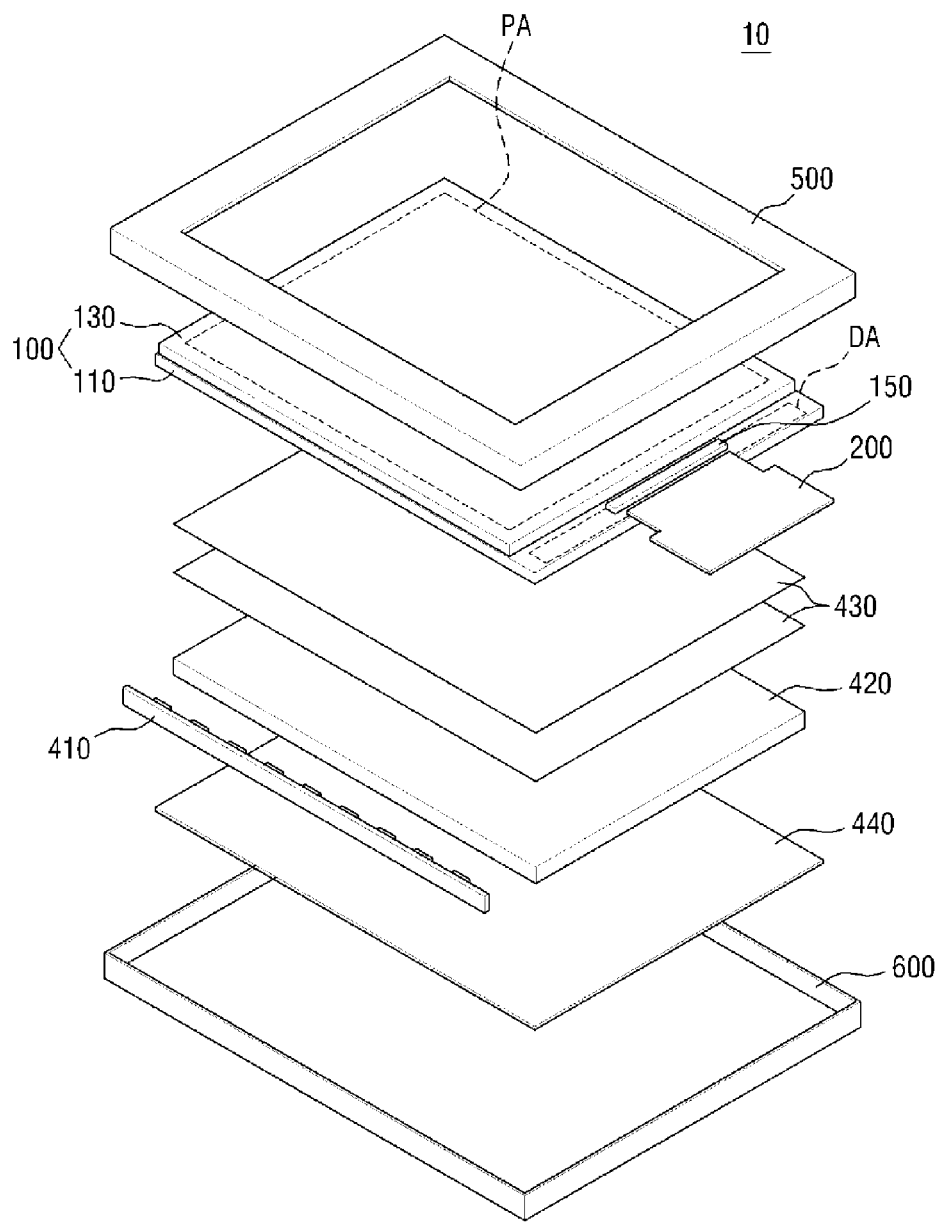
FIG. 1 is an exploded perspective view of a display device according to an exemplary embodiment of the present invention.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Although described with respect to a liquid crystal display (LCD), the display device according to the exemplary embodiments disclosed herein are not limited thereto. The invention can also be applied to other display devices, such as an organic light emitting diode display (OLED) and a plasma display panel (PDP).

Figure 2:
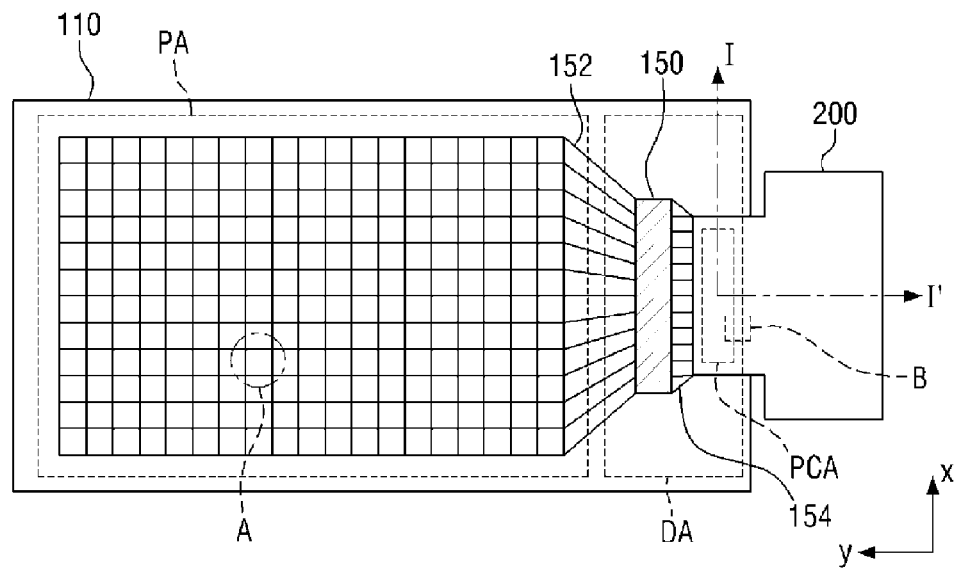
FIG. 2 is a plan view of a first substrate and a flexible printed circuit board of a display device according to an exemplary embodiment of the present invention.
Figure 3:
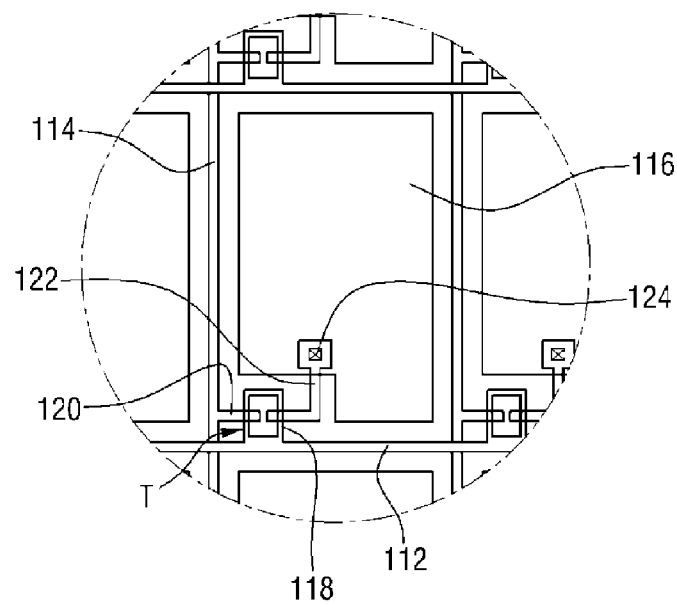
FIG. 3 is an enlarged view of a portion A of FIG. 2.
Figure 4:
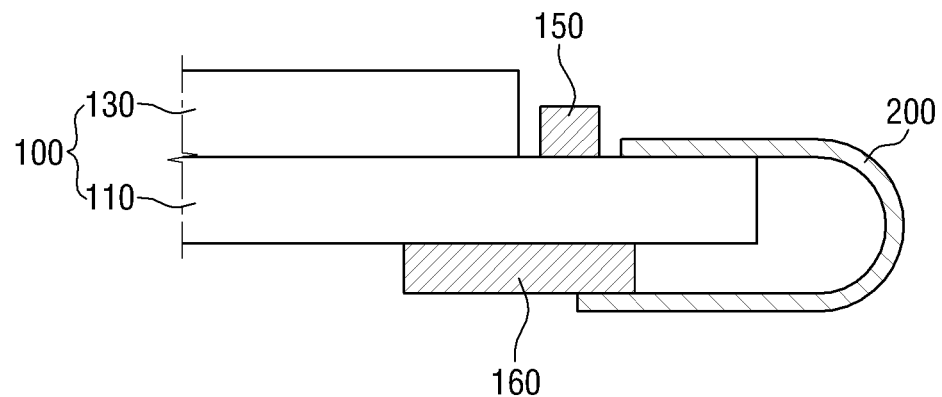
FIG. 4 is a side view of a display panel and a flexible printed circuit board of a display device according to an exemplary embodiment of the present invention.

FIG. 1 is an exploded perspective view of a display device according to an exemplary embodiment. FIG. 2 is a plan view of a first substrate and a flexible printed circuit board of a display device according to an exemplary embodiment, and FIG. 3 is an enlarged view of a portion A of FIG. 2. FIG. 4 is a side view of a display panel and a flexible printed circuit board of a display device according to an exemplary embodiment.

Referring to FIG. 1, a display device 10 according to an exemplary embodiment includes a display panel 100 and a flexible printed circuit board 200 attached to the display panel 100.

The display panel 100 includes a first substrate 110 and a second substrate 130 opposing the first substrate 110.

The first substrate 110 may include a pixel area PA and a drive area DA. The pixel area PA of the first substrate 110 overlaps the second substrate 130, but the drive area DA is not covered by the second substrate 130, so as to be exposed.

Referring to FIG. 2 and FIG. 3, the pixel area PA of the first substrate 110 may include a plurality of gate wires 112 extending in a first direction, and a plurality of data wires 114 extending in a second direction that is perpendicular to the first direction. A pixel electrode 116 may be arranged in an area that is defined by the gate wire 112 and the data wire 114. A gate electrode 118, which is a control terminal of a thin film transistor T, may be connected to the gate wire 112, a source electrode 120, which is an input terminal of the thin film transistor T, may be connected to the data wire 114, and a drain electrode 122, which is an output terminal of the thin film transistor T, may be connected to the pixel electrode 116 through a contact. The channel of the thin film transistor T may be formed by a semiconductor layer 124. The semiconductor layer 124 may be arranged to overlap the gate electrode 118. The source electrode 120 and the drain electrode 122 may be separated from each other on the basis of the semiconductor layer 124.

A drive unit that applies a driving signal to the pixel area PA may be formed in the drive area DA of the first substrate 110. As an example of the drive unit, a driver IC 150 may be mounted on the drive area DA. Further, a plurality of wires 152 and 154 for signal input/output to the driver IC 150 may be formed on the drive area DA of the first substrate 110. The wires 152 on one side based on the driver IC 150 are connected to the gate wires 112 and the data wires 114. A predetermined conductive pattern may be formed on the drive area DA of the first substrate 110 that is positioned on the other side based on the driver IC 150. The first substrate 110 may include a plurality of panel pads and signal wires connected to the pads. At least portions of the panel pads are electrically connected to the driver IC 150 through the signal wires.

The drive area DA may include a panel connection area PCA on which the display panel 100 and the flexible printed circuit board 200 are connected to each other. The panel connection area PCA may include an area where a conductive pattern that is arranged on one side of the first substrate 110 of the display panel 100 and a conductive pattern that is arranged on one side of the flexible printed circuit board are directly bonded to each other or an area where the conductive patterns are connected through an anisotropic conductive film.

Referring to FIG. 4, the flexible printed circuit board 200 is formed in a bent shape to electrically connect the display panel 100 and the printed circuit board 160 to each other. The printed circuit board 160 may generate a signal for driving the display panel 100. The printed circuit board 160 may be arranged on a lower portion of the display panel 100 as shown in FIG. 4 to reduce the size of the display panel 100.

Figure 5:
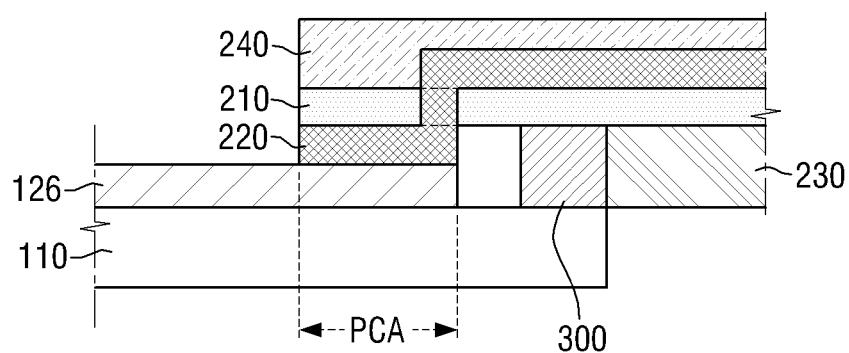
FIG. 5 is a cross-sectional view taken along line I-I' of FIG. 2.

FIG. 5 is a cross-sectional view taken along line I-I' of FIG. 2.

Figure 6:
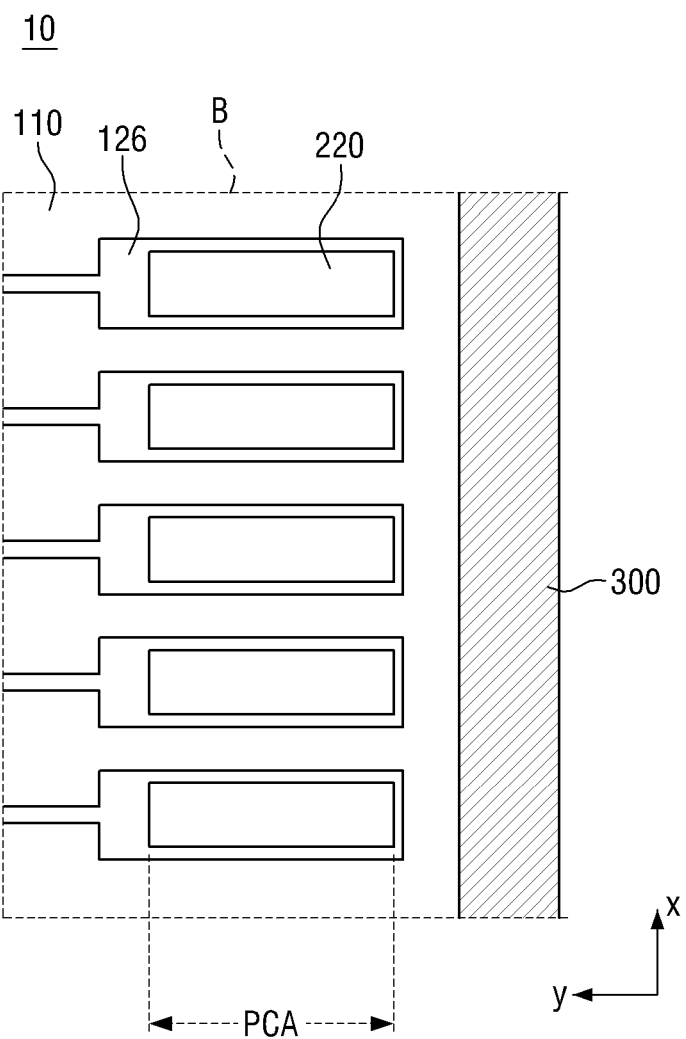
FIG. 6 is an enlarged plan view of a portion B of FIG. 2 taken at a plane of the intersection of the first and second conductive patterns.

FIG. 6 is a plan view illustrating a portion B of FIG. 2. Specifically, FIG. 6 is an enlarged view of a portion B of the display device according to an exemplary embodiment exemplified in FIG. 5. In FIG. 6, a portion of the second conductive pattern 220, which is not in contact with the first conductive pattern 126, is not shown.

Referring to FIG. 5 and FIG. 6, a first conductive pattern 126 is arranged on one side of the first substrate 110 of the display panel 100. On one side of the flexible printed circuit board, a second conductive pattern 220 that is connected to the first conductive pattern 126 is arranged. The first conductive pattern 126 and the second conductive pattern 220 may include a plurality of pads and signal wires connected to the pads.

The second conductive pattern 220 may be positioned on one surface of a base film 210 of the flexible printed circuit board 200, and protection layers 230 and 240 may be provided on one surface and the other surface of the base film 210. Hereinafter, the structure of the flexible printed circuit board 200 will be described in more detail.

FIG. 6 illustrates that the first conductive pattern 126 and the second conductive pattern 220 are arranged in parallel at a predetermined interval in X direction. However, this is merely exemplary, and the first conductive pattern 126 and the second conductive pattern 220 may be arranged in various shapes for efficient use of a space.

The display device 10 according to an exemplary embodiment of the present invention may include a dam pad 300 that is positioned between the first substrate 110 and base film 210 of the flexible printed circuit board 200 to be spaced apart a predetermined distance from the panel connection area PCA on which the first conductive pattern 126 and the second conductive pattern 220 are connected to each other. The dam pad 300 may be electrically separated from the first conductive pattern 126 and the second conductive pattern 220.

As shown in FIG. 5 and FIG. 6, the dam pad 300 may be positioned to be adjacent to an edge of one side of the first substrate 110. That is, the dam pad 300 may be positioned to be spaced apart for the predetermined distance from the panel connection area PCA to the edge side. The dam pad 300 may extend in a predetermined direction (e.g., X direction) with a long length. As illustrated in FIG. 6, the dam pad 300 may extend in the X direction at least a length of the second conductive pattern 220 in the X direction.

As described above, since the dam pad 300 is arranged on the outside of the first substrate 110 in comparison to the panel connection area PCA, moisture is prevented from permeating into the panel connection area PCA, and thus it may be advantageous to maintain a connection state between the first substrate 110 and the flexible printed circuit board 200. Further, the dam pad 300 can serve as a support against an external pressure, and thus it is advantageous to maintain the connection state between the first substrate 110 and the flexible printed circuit board 200. Further, although not separately indicated in the drawing, a moisture-resistant material may be positioned around the dam pad 300 and/or the panel connection area PCA, and through this, moisture can be prevented from permeating into the panel connection area PCA.

In some exemplary embodiments, as illustrated in FIG. 5 and FIG. 6, the dam pad 300 has a single-layer structure, and may be implemented to be attached to at least one of the first substrate 110 and the flexible printed circuit board 200, but is not limited thereto. The dam pad 300 may have a multilayer structure, and in this case, a part of the dam pad 300 may be attached to the first substrate 110 and the flexible printed circuit board 200, respectively.

Hereinafter, a case where the dam pad 300 is attached to the flexible printed circuit board 200 will be described in more detail.

Figure 7:
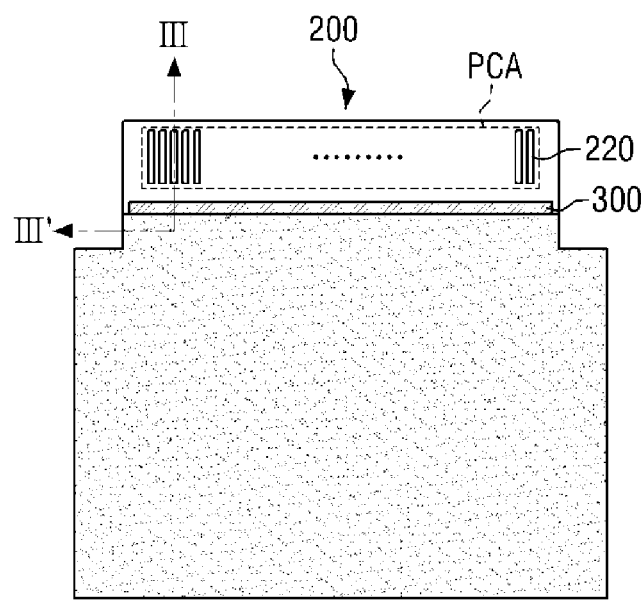
FIG. 7 is a plan view of a flexible printed circuit board according to an exemplary embodiment of the present invention.
Figure 8:
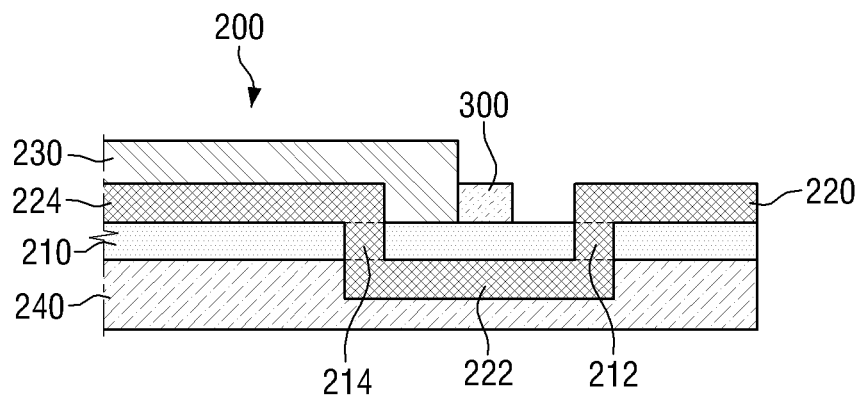
FIG. 8 and FIG. 9 are cross-sectional views of alternate exemplary embodiments taken along line III-III' of FIG. 7.
Figure 9:
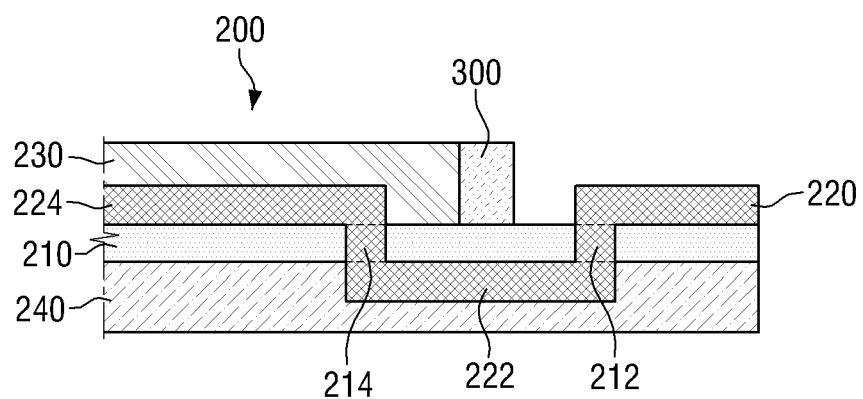

FIG. 7 is a plan view of a flexible printed circuit board according to an exemplary embodiment of the present invention, and FIG. 8 and FIG. 9 are cross-sectional views taken along line III-III' of FIG. 7. Specifically, FIG. 8 illustrates an example in which the dam pad 300 is entirely attached to the flexible printed circuit board 200, and FIG. 9 illustrates an example in which a part of the dam pad 300 is attached to the flexible printed circuit board 200.

Referring to FIGS. 7, 8, and 9, the flexible printed circuit board 200 according to an exemplary embodiment of the present invention includes a base film 210 having one surface and the other surface, a second conductive pattern 220 positioned on an edge of the one surface of the base film 210, and a dam pad 300 positioned on the one surface of the base film 210 to be spaced apart a predetermined distance from the second conductive pattern 220 and positioned on an inner side relative to the second conductive pattern 220. Here, the inner side may be an opposite side to the edge side on which the second conductive pattern 220 is arranged.

The flexible printed circuit board 200 may include a third conductive pattern 222 that is positioned on the other surface of the base film 210. On the base film 210, a contact hole 212 for connecting the second conductive pattern 220 and the third conductive pattern 222 to each other may be formed. The second conductive pattern 220 may include a plurality of pads, and the third conductive pattern 222 may include a plurality of signal wires connected to the plurality of pads through the contact hole 212.

The flexible printed circuit board 200 may include a first protection layer 230 provided on the one surface of the base film 210 and a second protection layer 240 provided on the other surface of the base film 210, and upper portions of the dam pad 300 and the second conductive pattern 220 may be exposed. That is, the first protection layer 230 may not cover the dam pad 300 and the second conductive pattern 220.

Although not separately indicated in the drawing, on the one surface of the base film 210 of the flexible printed circuit board 200, an external terminal connection area that is connected to another printed circuit board or input devices may be positioned. A fourth conductive pattern 224 may be formed on the external terminal connection area, and on the base film 210, a contact hole 214 for connecting the fourth conductive pattern 224 that is arranged on the one surface of the base film 210 and the third conductive pattern 222 that is arranged on the other surface of the base film 210 to each other may be formed.

The dam pad 300 and the second conductive pattern 220 may be made of the same material. Accordingly, it is advantageous to simplify fabrication of the flexible printed circuit board 200.

The dam pad 300 may be implemented with various thicknesses in consideration of bonding between the display panel 100 and the flexible printed circuit board 200. For example, as illustrated in FIG. 8, in the case of implementing the dam pad in a single-layer structure, the thickness of the dam pad 300 may be substantially equal to the thickness of the second conductive pattern layer 220, but is not limited thereto. Further, as illustrated in FIG. 9, in the case of implementing the dam pad in a single layer structure, or as illustrated in FIG. 10 where the dam pad is implemented in a multilayer structure, the thickness of the dam pad 300 may be substantially equal to the thickness of the first protection layer 230, but is not limited thereto.

On the other hand, although not separately indicated in the drawings, the flexible printed circuit board 200 according to an exemplary embodiment of the present invention may include a dam pad that extends in a first direction and a dam pad that extends in a second direction that is different from the first direction. The dam pad that extends in the first direction and the dam pad that extends in the second direction may be connected to each other.

In some exemplary embodiments as described above, the dam pad 300 may be implemented to have a multilayer structure, and hereinafter, this feature will be described in more detail.

Figure 10:
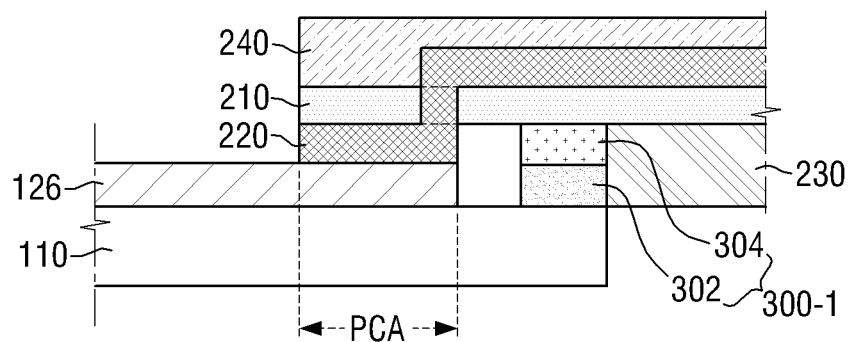
FIG. 10 is a cross-sectional view of a portion I-I' of FIG. 2 in a display device according to another exemplary embodiment of the present invention.

FIG. 10 illustrates a display device according to another exemplary embodiment of the present invention. More specifically, FIG. 10 is a cross-sectional view of portions I to I' of FIG. 2 illustrating a display device according to another exemplary embodiment of the present invention.

Unlike the display device 10 (in FIG. 5) as described above with reference to FIG. 5 and FIG. 6, a display device 11 according to this exemplary embodiment includes a dam pad 300-1 of which the configuration is different from the configuration of the dam pad 300 as described above. Other configurations of the display device 11 according to this exemplary embodiment are equal to or similar to those of the display device 10, and hereinafter, explanation will be made around different points between this exemplary embodiment and the exemplary embodiment of FIG. 5 and FIG. 6 to exclude the duplicate portion.

Referring to FIG. 10, unlike the dam pad 300 (in FIG. 5) illustrated in FIGS. 5 and 6, the dam pad 300-1 according to this exemplary embodiment may include a first pad 302 that is bonded to the first substrate 110 and a second pad 304 that is bonded to the flexible printed circuit board 200. The first pad 302 may be positioned on one surface of the first substrate 110 that faces the flexible printed circuit board 200, and the second pad 304 may be positioned on one surface of the flexible printed circuit board 200 that faces the first substrate 110.

As illustrated in FIG. 10, the first pad 302 and the second pad 304 may be positioned on portions that mutually correspond to each other, and may be mutually bonded to each other. In other words, the first pad 302 and the second pad 304 may come in physical contact with each other.

In some exemplary embodiments, the width of the first pad 302 and the width of the second pad 304 may be substantially equal to each other as illustrated in FIG. 10. Further, as seen from a plan view, the first pad 302 and the second pad 304 may completely overlap each other in a state where they are bonded to each other.

Figure 11:
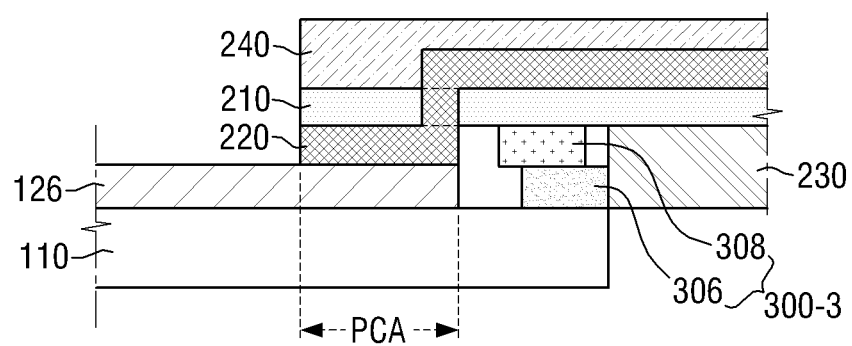
FIG. 11, FIG. 13, FIG. 15, and FIG. 17 are cross-sectional views of a portion I-I' of FIG. 2 in a display device according to still other exemplary embodiments of the present invention.
Figure 12:
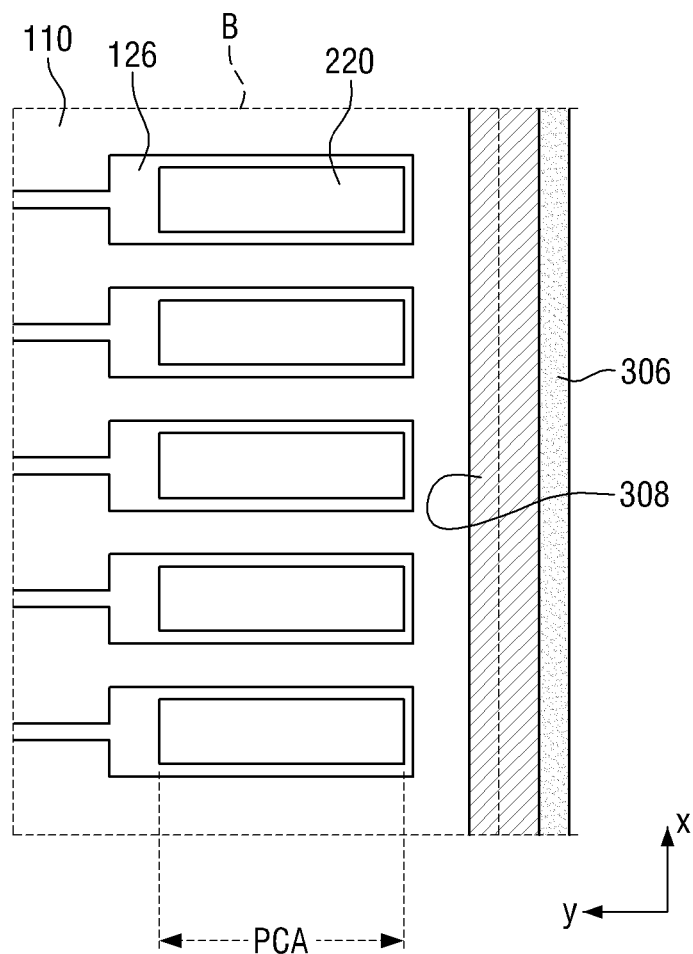
FIG. 12, FIG. 14, FIG. 16, and FIG. 18 are enlarged plan views of a portion B of a display device according to the exemplary embodiments exemplified in FIG. 11, FIG. 13, FIG. 15, and FIG. 17, respectively, taken at a plane of the intersection of the first and second conductive patterns.

FIG. 11 illustrates a display device according to still another exemplary embodiment of the present invention. More specifically, FIG. 11 is a cross-sectional view of portions I to I' of FIG. 2 illustrating a display device according to still another exemplary embodiment of the present invention. Further, FIG. 12 is an enlarged view of a portion B of FIG. 2, and more specifically, FIG. 12 is an enlarged view of a portion B of the display device according to the exemplary embodiment exemplified in FIG. 11. In FIG. 12, a portion of the second conductive pattern 220, which is not contact with the first conductive pattern 126, is not shown.

Unlike the display device 10 (in FIG. 5) as described above with reference to FIGS. 5 and 6, a display device 13 according to this exemplary embodiment includes a dam pad 300-3 of which the configuration is different from the configuration of the dam pad 300 as described above. Other configurations of the display device 13 according to this exemplary embodiment are equal to or similar to those of the display device 10 according to the above-described exemplary embodiment of FIG. 5 and FIG. 6. Hereinafter, explanation will be made around different points between this exemplary embodiment and the above-described exemplary embodiment to exclude the duplicate portion.

Referring to FIGS. 11 and 12, unlike the dam pad 300 (in FIG. 5) illustrated in FIGS. 5 and 6, the dam pad 300-3 according to this exemplary embodiment may include a first pad 306 that is bonded to the first substrate 110 and a second pad 308 that is bonded to the flexible printed circuit board 200. The first pad 306 may be positioned on one surface of the first substrate 110 that faces the flexible printed circuit board 200, and the second pad 308 may be positioned on one surface of the flexible printed circuit board 200 that faces the first substrate 110.

In some exemplary embodiments, the widths of the first pad 306 and the second pad 308 may be substantially equal to each other, but are not limited thereto. Unlike the dam pad 300-1 illustrated in FIG. 10, according to the dam pad 300-3 according to this exemplary embodiment, as seen from a plan view, the first pad 306 and the second pad 308 may partially overlap each other in a state where they are bonded to each other.

Figure 13:
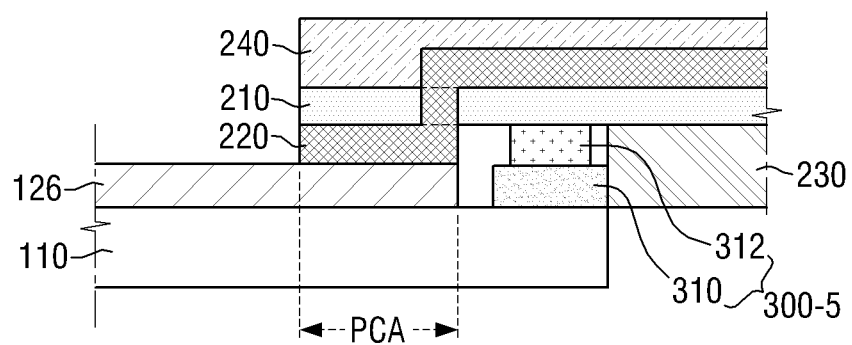
Figure 14:
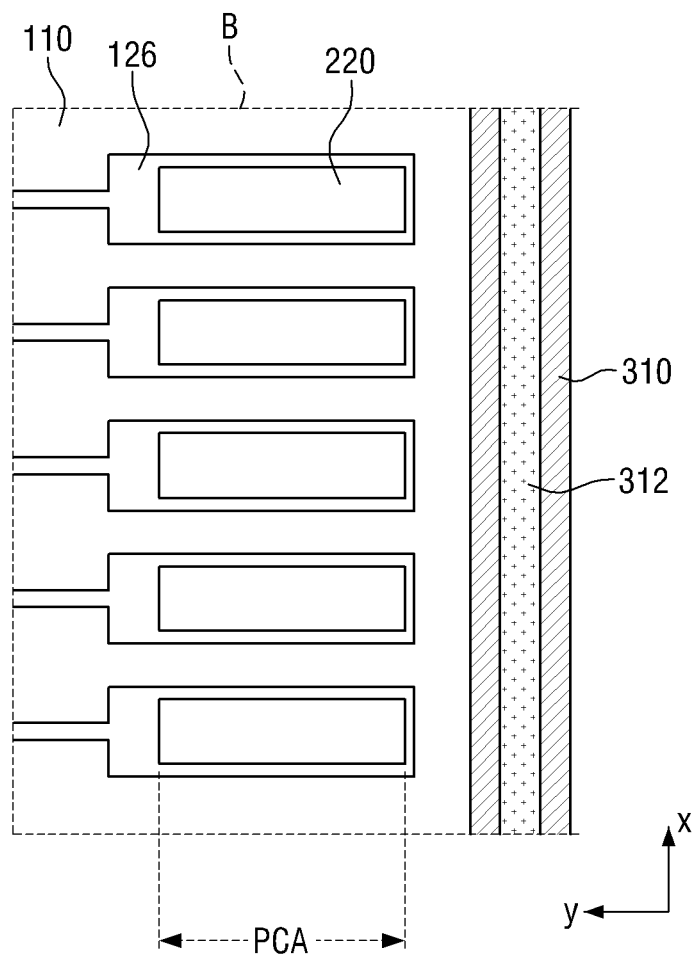

FIG. 13 illustrates a display device according to still another exemplary embodiment of the present invention. More specifically, FIG. 13 is a cross-sectional view of portions I to I' of FIG. 2 illustrating a display device according to still another exemplary embodiment of the present invention. Further, FIG. 14 is an enlarged view of a portion B of FIG. 2, and more specifically, FIG. 14 is an enlarged view of a portion B of the display device according to the exemplary embodiment exemplified in FIG. 13. In FIG. 14, a portion of the second conductive pattern 220, which is not in contact with the first conductive pattern 126, is not shown.

Unlike the display device 10 (in FIG. 5) as described above with reference to FIGS. 5 and 6, a display device 15 according to this exemplary embodiment includes a dam pad 300-5 of which the configuration is different from the configuration of the dam pad 300 as described above. Other configurations of the display device 15 according to this exemplary embodiment are equal to or similar to those of the display device 10 according to the above-described exemplary embodiment. Hereinafter, explanation will be made around different points between this exemplary embodiment and the above-described exemplary embodiment to exclude the duplicate portion.

Referring to FIGS. 13 and 14, unlike the dam pad 300 (in FIG. 5) illustrated in FIGS. 5 and 6, the dam pad 300-5 according to this exemplary embodiment may include a first pad 310 that is bonded to the first substrate 110 and a second pad 312 that is bonded to the flexible printed circuit board 200. The first pad 310 may be positioned on one surface of the first substrate 110 that faces the flexible printed circuit board 200, and the second pad 312 may be positioned on one surface of the flexible printed circuit board 200 that faces the first substrate 110.

In some exemplary embodiments, the widths of the first pad 310 and the second pad 312 may be different from each other. As illustrated in FIG. 13, according to the dam pad 300-5 according to this exemplary embodiment, the width of the first pad 310 may be larger than the width of the second pad 312, and at least a part of the first pad 310 may overlap the second pad 312. FIGS. 13 and 14 exemplify a case where the width of the first pad 310 is larger than the width of the second pad 312, but is not limited thereto. The width of the second pad 312 may also be larger than the width of the first pad 310.

Figure 15:
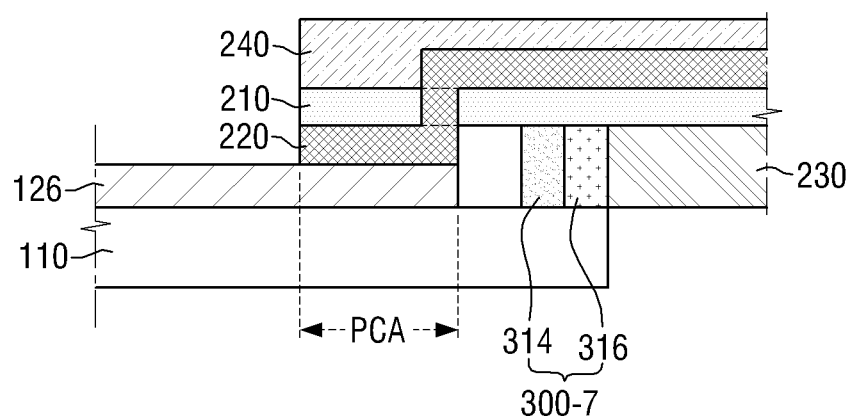
Figure 16:
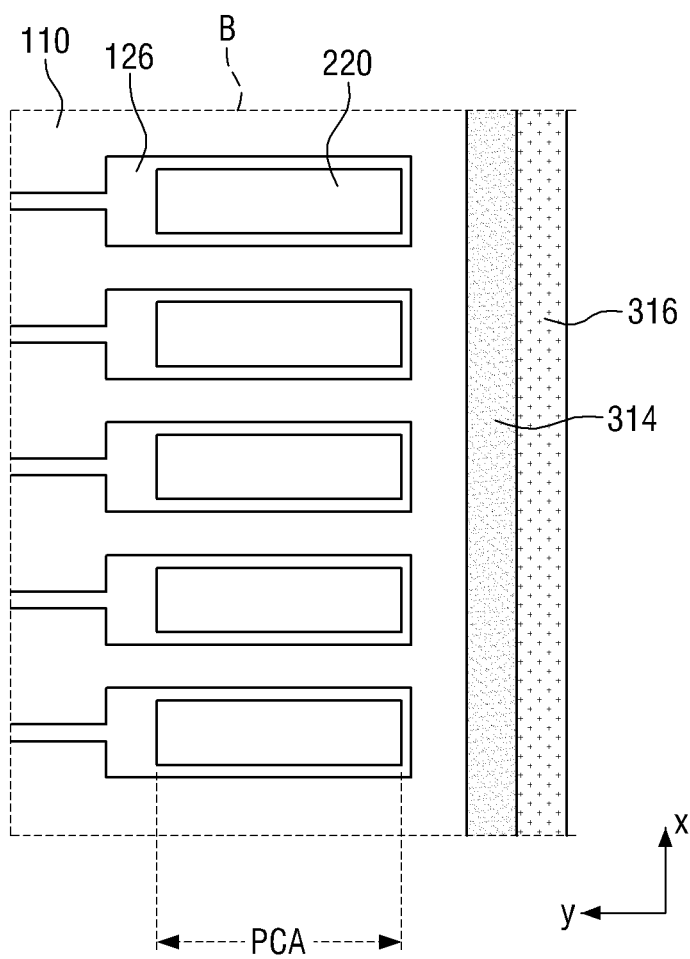
Figure 18:
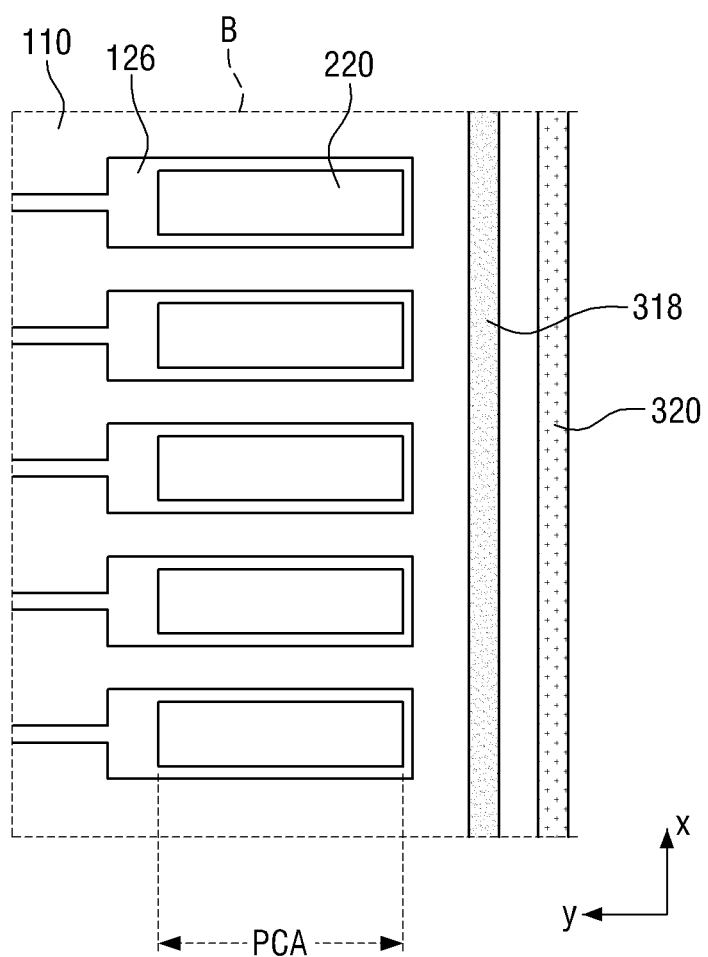

FIG. 15 illustrates a display device according to still another exemplary embodiment of the present invention. More specifically, FIG. 15 is a cross-sectional view of portions I to I' of FIG. 2 illustrating a display device according to still another exemplary embodiment of the present invention. Further, FIG. 16 is an enlarged view of a portion B of FIG. 2, and more specifically, FIG. 16 is an enlarged view of a portion B of the display device according to the exemplary embodiment exemplified in FIG. 15. In FIG. 18, a portion of the second conductive pattern 220, which is not in contact with the first conductive pattern 126, is not shown.

Unlike the display device 10 (in FIG. 5) as described above with reference to FIGS. 5 and 6, a display device 17 according to this exemplary embodiment includes a dam pad 300-7 of which the configuration is different from the configuration of the dam pad 300 as described above. Other configurations of the display device 17 according to this exemplary embodiment are equal to or similar to those of the display device 10 according to the above-described exemplary embodiment. Hereinafter, explanation will be made around different points between this embodiment and the above-described embodiment to exclude the duplicate portion.

Referring to FIGS. 15 and 16, unlike the dam pad 300 (in FIG. 5) illustrated in FIGS. 5 and 6, the dam pad 300-7 according to this exemplary embodiment may include a first pad 314 that is bonded to the first substrate 110 and a second pad 316 that is bonded to the flexible printed circuit board 200. The first pad 314 may be positioned on one surface of the first substrate 110 that faces the flexible printed circuit board 200, and the second pad 316 may be positioned on one surface of the flexible printed circuit board 200 that faces the first substrate 110.

In some exemplary embodiments, one side portion of the first pad 314 may come in contact with one side portion of the second pad 316. FIGS. 15 and 16 exemplify a case where the thickness of the first pad 314 is equal to the thickness of the second pad 316, but is not limited thereto. The thickness of the first pad 314 may be different from the thickness of the second pad 316. That is, a part of one side portion of the first pad 314 may come in contact with a part of one side portion of the second pad 316.

Figure 17:
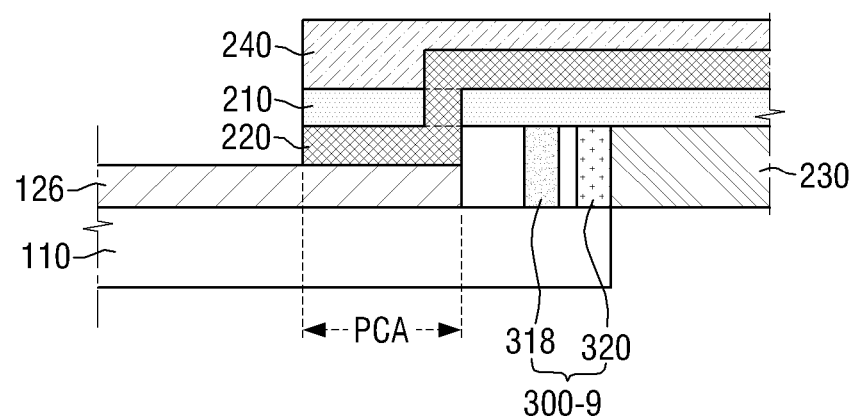

FIG. 17 illustrates a display device according to still another exemplary embodiment of the present invention. More specifically, FIG. 17 is a cross-sectional view of portions I to I' of FIG. 2 illustrating a display device according to still another exemplary embodiment of the present invention. Further, FIG. 18 is an enlarged view of a portion B of FIG. 2, and more specifically, FIG. 18 is an enlarged view of a portion B of the display device according to the exemplary embodiment exemplified in FIG. 17.

A display device 19 according to this exemplary embodiment includes a dam pad 300-9 of which the configuration is different from the configuration of the dam pad 300 of the display device 10 (in FIG. 5) as described above with reference to FIG. 5 and FIG. 6. Other configurations of the display device 19 according to this embodiment are equal to or similar to those of the display device 10 according to the above-described exemplary embodiment. Hereinafter, explanation will be made around different points between this exemplary embodiment and the above-described exemplary embodiment to exclude the duplicate portion.

Referring to FIGS. 17 and 18, unlike the dam pad 300 (in FIG. 5) illustrated in FIGS. 5 and 6, the dam pad 300-9 according to this exemplary embodiment may include a first pad 318 that is bonded to the first substrate 110 and a second pad 320 that is bonded to the flexible printed circuit board 200. The first pad 318 may be positioned on one surface of the first substrate 110 that faces the flexible printed circuit board 200, and the second pad 320 may be positioned on one surface of the flexible printed circuit board 200 that faces the first substrate 110.

In some exemplary embodiments, the first pad 318 and the second pad 320 may be arranged to be spaced apart a predetermined distance from each other. FIGS. 17 and 18 exemplify a case where the thickness of the first pad 318 is equal to the thickness of the second pad 320, but is not limited thereto. The thickness of the first pad 318 may be different from the thickness of the second pad 320.

Further, FIGS. 17 and 18 exemplify a case where the first pad 318 comes in contact with a base film 210 of the flexible printed circuit board 200, and the second pad 320 comes in contact with the first substrate 110 of the display panel 100, but is not limited thereto. The first pad 318 may not come in contact with the base film 210 of the flexible printed circuit board 200, and the second pad 320 may not come in contact with the first substrate 110 of the display panel 100.

On the other hand, the first pads 302, 306, 310, 314, and 318 may be made of the same material as the material of the first pattern 126 that is arranged on one side of the first substrate 110 of the display panel 100, and the second pads 304, 308, 312, 316, and 320 may be made of the same material as the material of the second conductive pattern 220 that is arranged on one side of the flexible printed circuit board 200. Since the pads are made of the same material, it may be advantageous to simplify the fabrication of the display devices 11, 13, 15, 17, and 19.

Figure 19:
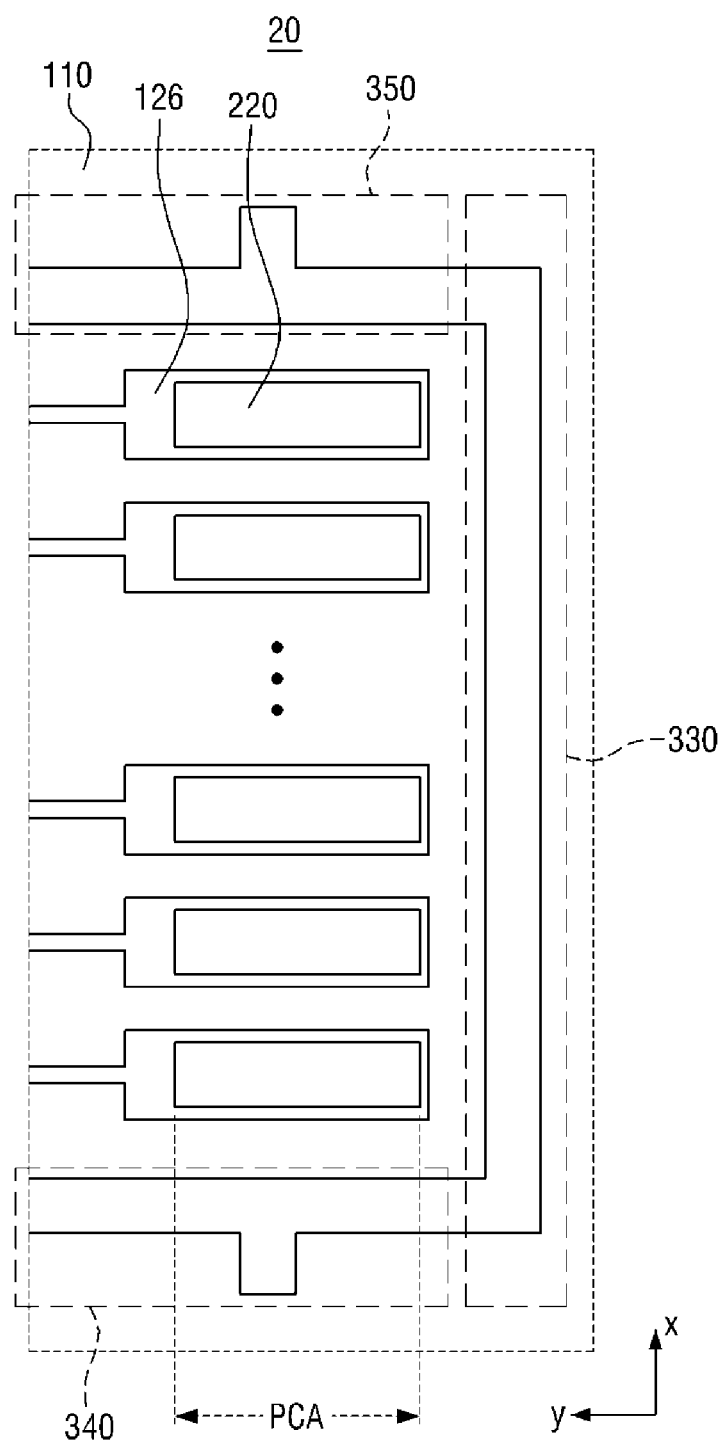
FIG. 19 is a plan view illustrating a dam pad and a panel connection area of a display device according to yet another exemplary embodiment of the present invention.

FIG. 19 is a plan view illustrating a dam pad and a panel connection area of a display device according to still another exemplary embodiment of the present invention. In FIG. 19, a portion of the second conductive pattern 220, which is not in contact with the first conductive pattern 126, is not shown.

Referring to FIG. 19, a display device 20 according to this exemplary embodiment is different from the display device according to the exemplary embodiment of FIG. 6 on the point that the display device 20 includes a first dam pad 330 that extends in the first direction (X direction), and a second dam pad 340 and a third dam pad 350 that extend in the second direction (Y direction) that is different from the first direction.

Specifically, the display device 20 according to an exemplary embodiment of the present invention includes a first dam pad 330 that extends in the first direction (X direction), and a second dam pad 340 and a third dam pad 350 that extend in the second direction (Y direction), that is, in a direction that is perpendicular to the first direction, from both ends of the first dam pad 330. FIG. 19 exemplifies a case where the extending direction of the first dam pad 330 is perpendicular to the extending direction of the second and third dam pads 340 and 350, but is not limited thereto. Further, it is exemplified that the second and third dam pads 340 and 350 extend in the second direction from the both ends of the first dam pad 330, but is not limited thereto.

As illustrated in FIG. 19, the first dam pad 330 and the second and third dam pads 340 and 350 may be connected to each other. For example, the dam pad 330 and the dam pads 340 and 350 may be in a body or may be bonded to each other.

The first dam pad 330 and the second and third dam pads 340 and 350 may be positioned to be spaced apart a predetermined distance from a panel connection area PCA. The first dam pad 330 may be positioned on the outside of the first substrate 110 in comparison to the panel connection area PCA, and for example, the first dam pad 330 may be positioned adjacent to an edge of one side of the first substrate 110. The second dam pad 340 may be positioned on one side of the panel connection area PCA, and the third dam pad 350 may be positioned on the other side of the panel connection area PCA.

The second and third dam pads 340 and 350 may be alignment keys formed to align the first conductive pattern 126 that is arranged on one side of the first substrate 110. The first dam pad 330 and the second and third dam pad 340 and 350 may be electrically separated from the first conductive pattern 126 and the second conductive pattern 220.

As described above, since the display device 20 according to this exemplary embodiment includes the first dam pad 330 that extends in the first direction (X direction) and the second dam pads 340 and 350 that extend in the second direction (Y direction) that is different from the first direction, moisture can be prevented from permeating into the panel connection area PCA in several directions, and thus it is more preferable to maintain the connection state between the first substrate 110 and the flexible printed circuit board 200.

Referring again to FIG. 1, the second substrate 130 of the display panel 100 is arranged to face the first substrate 110. The second substrate 130 may include a plurality of red, green, and blue color filters. The respective color filters may correspond to the respective pixel electrodes. Black matrices may be arranged on the boundaries and outmost portions of the respective color filters. A common electrode may be formed on front surfaces of the color filters.

A liquid crystal layer may be interposed between the first substrate 110 and the second substrate 130. Alignment layers may be formed on surfaces of the first substrate 110 and the second substrate 130 that come in contact with the liquid crystal layer.

Between the first substrate 110 and the second substrate 130, a sealing member, such as a sealant, may be arranged along circumferential portions of the respective substrates to bond and seal the first substrate 110 and the second substrate 130.

A light source assembly is arranged below the display panel 100. The light source assembly may include a light source 410, a light guide panel 420 guiding light that is emitted from the light source 410, a reflective sheet 440 arranged on a lower side of the light guide panel 420, and at least one optical sheet 430 arranged on an upper side of the light guide panel 420 to modulate the optical characteristics of the emitted light.

The light source 410 is arranged on one side of the light guide panel 420. The light source 410 may be composed of, for example, LED (Light Emitting Diode), CCFL (Cold Cathode Fluorescent Lamp), HCFL (Hot Cathode Fluorescent Lamp), or EEFL (External Electrode Fluorescent Lamp). In another exemplary embodiment, the light source 410 may be arranged on both sides of the light guide panel 420.

The light guide panel 420 moves the light emitted from the light source 410 through total internal reflection, and emits the light to an upper side through a scattering pattern formed on a lower surface of the light guide panel 420. The reflective sheet 440 is arranged below the light guide panel 420 to reflect the light that is emitted downward from the light guide panel 420 to the upper portion.

The optical sheet 430 is arranged on the upper portion of the light guide panel 420. The optical sheet 430 may include, for example, a diffusion film diffusing the incident light, a prism sheet collecting the incident light, a luminance enhancement film partially reflecting an incident linearly polarized light, a liquid crystal film partially reflecting the incident circularly polarized light, a phase difference film converting the circularly polarized light into the linearly polarized light, and/or a protection film.

The display device 10 may further include an upper case 500 and a lower case 600. The upper case 500 may be arranged on the upper portion of the display panel 100. The upper case 500 may configure outlines of upper and side portions of the display device 10. The upper case may include an opening for exposing the display panel 100 to the upper portion.

The lower case 600 may configure the outline of the lower portion of the display device 10. In the lower case 600, constituent elements of the display device 10 except for the upper case 500 may be accommodated. The lower case 600 may include a side surface that extends from the bottom surface and the circumference of the bottom surface to the upper side. The side surface of the lower case 600 may be arranged on an inner side than the side surface of the upper case 500, but is not limited thereto.

In the above-described exemplary embodiments, it is exemplified that the light source assembly is an edge type light source assembly in which a light source is positioned on the side thereof, but is not limited thereto. The present invention can be applied to a direct type light source assembly in which a light source is positioned on the lower portion thereof. Further, in other exemplary embodiments, it is exemplified that the light source assembly is arranged below the display panel 100. However, the light source assembly may be arranged on the upper side of the display panel 100.

According to exemplary embodiments, at least the following effects can be achieved. The flexible printed circuit board and the display device including the same according to an exemplary embodiment can prevent the moisture from permeating into the bonding areas of the flexible printed circuit board and the display panel. The flexible printed circuit board and the display device including the same according to an exemplary embodiment can prevent the bonding areas of the flexible printed circuit board and the display panel from being separated from each other by an external pressure.

Although certain exemplary embodiments and implementations have been described herein, other exemplary embodiments and modifications will be apparent from this description. Accordingly, the inventive concept is not limited to such exemplary embodiments, but rather to the broader scope of the presented claims and various obvious modifications and equivalent arrangements.

What is claimed is:

1. A display device comprising:
   a display panel comprising a substrate having one side on which a first conductive pattern is arranged;
   a flexible printed circuit board having one side on which a second conductive pattern that is connected to the first conductive pattern is arranged; and
   a dam pad disposed between the substrate and the flexible printed circuit board to be spaced apart from an area to which the second conductive pattern is connected,
   wherein the dam pad comprises:
   a first dam pad that extends in a first direction; and
   a second dam pad that extends in a second direction that is different from the first direction.

2. The display device of claim 1, wherein the dam pad is disposed adjacent to an edge of one side of the substrate.

3. The display device of claim 1, wherein the dam pad comprises a first pad disposed on one surface of the substrate that faces the flexible printed circuit board and a second pad disposed on one surface of the flexible printed circuit board that faces the substrate.

4. The display device of claim 3, wherein at least parts of the first pad and the second pad overlap each other.

5. The display device of claim 3, wherein one side portion of the first pad contacts one side portion of the second pad.

6. The display device of claim 3, wherein the first pad and the second pad are spaced apart a predetermined distance from each other.

7. The display device of claim 3, wherein the first pad and the first conductive pattern are made of the same material, and the second pad and the second conductive pattern are made of the same material.

8. The display device of claim 1, wherein the first dam pad and the second dam pad of the dam pad are connected to each other.

9. The display device of claim 1, wherein the first dam pad is positioned adjacent to an edge of one side of the substrate.

10. A flexible printed circuit board comprising:
    a base film having one surface and an opposing other surface;
    a first conductive pattern disposed at an edge of one side of the one surface of the base film; and
    a dam pad disposed on the one surface of the base film to be spaced apart from the first conductive pattern and disposed on an inner side of the one surface relative to the first conductive pattern,
    wherein the dam pad comprises:
    a first dam pad that extends in a first direction; and
    a second dam pad that extends in a second direction that is different from the first direction.

11. The flexible printed circuit board of claim 10, further comprising a second conductive pattern positioned on the other surface of the base film,
    wherein a contact hole for electrically connecting the first conductive pattern and the second conductive pattern to each other is formed in the base film.

12. The flexible printed circuit board of claim 10, wherein the first dam pad and the second dam pad of the dam pad are connected to each other.

13. The flexible printed circuit board of claim 10, wherein the dam pad and the first conductive pattern are made of the same material.

14. The flexible printed circuit board of claim 10, further comprising a first protection layer provided on the one surface of the base film and a second protection layer provided on the other surface of the base film,
    wherein upper portions of the dam pad and the first conductive pattern are exposed.

* * * * *